(12) United States Patent
Papageorgiou

(10) Patent No.: US 7,749,789 B2
(45) Date of Patent: Jul. 6, 2010

(54) CMOS-COMPATIBLE BULK-MICROMACHINING PROCESS FOR SINGLE-CRYSTAL MEMS/NEMS DEVICES

(75) Inventor: Demetrios P Papageorgiou, Weston, MA (US)

(73) Assignee: Solid-State Research, Inc., Weston, MA (US)

( * ) Notice: Subject to any disclaimer, the term of this patent is extended or adjusted under 35 U.S.C. 154(b) by 336 days.

(21) Appl. No.: 12/050,206

(22) Filed: Mar. 18, 2008

(65) Prior Publication Data
US 2009/0275162 A1 Nov. 5, 2009

(51) Int. Cl.
*H01L 21/20* (2006.01)
(52) U.S. Cl. .............................. 438/48; 438/50; 438/52; 438/53; 438/694; 257/E29.324
(58) Field of Classification Search .................. 438/29, 438/48–53, 453–459, 694, 723; 257/E21.001, 257/141, 152, 585, 586, 29.324
See application file for complete search history.

(56) References Cited

U.S. PATENT DOCUMENTS

| | | | | |
|---|---|---|---|---|
| 6,362,512 B1 * | 3/2002 | Kubby et al. | ................ | 257/415 |
| 6,379,989 B1 * | 4/2002 | Kubby et al. | .................. | 438/52 |
| 6,458,615 B1 | 10/2002 | Fedder et al. | | |
| 6,664,126 B1 * | 12/2003 | Devoe et al. | ................... | 438/50 |
| 6,720,267 B1 * | 4/2004 | Chen et al. | .................. | 438/694 |
| 6,734,762 B2 | 5/2004 | Cornett et al. | | |
| 6,768,628 B2 * | 7/2004 | Harris et al. | ................. | 361/277 |
| 6,905,616 B2 * | 6/2005 | Kumar et al. | ................... | 216/2 |
| 6,940,370 B2 | 9/2005 | Bircumshaw et al. | | |
| 7,023,065 B2 | 4/2006 | Ayazi et al. | | |
| 7,104,129 B2 | 9/2006 | Nasiri et al. | | |
| 7,172,917 B2 | 2/2007 | Partridge et al. | | |
| 7,178,378 B2 | 2/2007 | Crawley et al. | | |
| 7,195,946 B2 * | 3/2007 | D'Arrigo et al. | .............. | 438/54 |
| 7,261,825 B2 | 8/2007 | Metzger et al. | | |
| 7,352,040 B2 * | 4/2008 | Partridge et al. | ............ | 257/419 |
| 2002/0145489 A1 * | 10/2002 | Cornett et al. | .............. | 333/197 |
| 2005/0176179 A1 * | 8/2005 | Ikushima et al. | ............ | 438/125 |
| 2007/0072327 A1 | 3/2007 | Weigold | | |
| 2007/0281381 A1 * | 12/2007 | Ayazi | .......................... | 438/52 |

OTHER PUBLICATIONS

PCT Search Report dated Apr. 7, 2009 of Patent Application No. PCT/US09/34957 filed Feb. 24, 2009.

* cited by examiner

*Primary Examiner*—Michael S Lebentritt
(74) *Attorney, Agent, or Firm*—Vern Maine & Associates

(57) ABSTRACT

A process producing a single-crystalline device fabricated on a single-sided polished wafer employing processing from only the front-side and having a significant separation between the device and substrate is provided. In one embodiment, a method comprises an upper layer and a lower substrate. A device is formed in the upper layer, defined by gaps. The gaps are filled with at least one material that has etch characteristics different from those of the device and the substrate. At least a top portion of the gap material is removed from the upper layer. The gap material is etched so that a portion of the gap-material remains on the sidewalls of the surrounding upper layer. The material beneath the device is then etched, excluding an insulating layer beneath the device, releasing the device from the substrate. The insulating material beneath the device is then etched, the etch being selective to the insulating material and the gap material.

20 Claims, 12 Drawing Sheets

CMOS-COMPATIBLE BULK-MICROMACHINING PROCESS FOR SINGLE-CRYSTAL MEMS/NEMS DEVICES

FIELD OF THE INVENTION

The invention relates to microelectromechanical systems (MEMS) and nanoelectromechanical systems (NEMS) device fabrication, including embodiments to processes producing a single-crystalline device fabricated on a single-sided or double-sided polished wafer employing processing from only one side and having a significant separation between the device and substrate.

BACKGROUND OF THE INVENTION

MEMS and NEMS technology continues to find new applications and employ multiple fabrication techniques. One known fabrication approach uses a high-temperature low pressure chemical vapor deposition (LPCVD) process to deposit polycrystalline silicon on top of a wafer with complementary metal-oxide-semiconductor (CMOS) circuitry. The polycrystalline silicon is then patterned to form a resonator.

In another known approach, a resonator is made through bulk micromachining on a silicon-on-insulator (SOI) wafer. The insulating layer acts as an etch stop for the deep reactive ion etch (DRIE) which defines the resonator shape in two dimensions (the plane of the wafer). The trenches are then refilled with silicon dioxide, and an epitaxial layer of silicon is grown over the device. This layer allows for circuitry to be later fabricated above the MEMS device. Next, holes are etched into the epitaxial layer to allow a vapor, such as a hydrofluoric (HF) acid etch in to selectively etch the silicon dioxide and release the resonator. Finally, the holes are filled using a vacuum deposition process resulting in a vacuum-sealed MEMS resonator.

Another known process is directed at producing a surface micromachined resonator similar to that above. However, this process uses polycrystalline SiGe instead of polycrystalline silicon. There are two methods: 1. Deposit the SiGe as a polycrystalline material which requires a lower temperature than that of polycrystalline silicon or 2. Deposit the SiGe at an even lower temperature which results in amorphous SiGe, and then use a laser to rapidly heat the surface which results in polycrystalline SiGe and does not affect any underlying circuitry.

Yet another process is similar to the previous except that a dome shape is achieved by depositing polycrystalline silicon over a sacrificial oxide at a temperature where the polycrystalline silicon is compressively stressed.

Existing methods include three release techniques: basic, backside, and surface micromachining.

For the basic release technique, the device is shaped on the front side of an SOI wafer. HF is then used to release the device by etching the insulator layer. Disadvantages include that the device's proximity to the substrate is defined by the insulator layer. This subjects the device to a higher risk of stiction during processing and operation.

For the backside release technique, SOI wafers have the device created on the front side. After all processing is completed, etch holes are patterned on the backside and the wafer is etched from the backside. The insulator layer behaves as an etch-stop. The insulator is then etched separately in an etch which is selective to just the insulator, which releases the structure. Disadvantages include a backside alignment which requires double-side polished wafers that is less accurate (front-to-back alignment) and which requires a larger dead-space around the device. This also requires a long backside etch and results in a weaker wafer.

For the surface micromachining technique, the devices are made above the plane of the wafer using processes such as chemical vapor deposition (CVD) to deposit the device material on top of a sacrificial material. The material is then patterned and the device is released using an etch which is selective to only the sacrificial material. The material used for this is not single-crystal, resulting in poorer behaviors including lower Q when used for a resonant device.

What is needed, therefore, are techniques for single-sided fabrication with enhanced compatibility of MEMS technology with standard CMOS technology and a process by which single-crystal MEMS/NEMS devices can be created alongside circuitry without the need for processing from the backside of the wafer.

SUMMARY OF THE INVENTION

One embodiment of the present invention provides a process by which single-crystal MEMS/NEMS devices can be created alongside circuitry without the need for processing from the backside of the wafer. References to MEMS fabrication methods and MEMS devices include NEMS fabrication and NEMS devices unless specifically mentioned otherwise. This may be referred to as micro/nanoelectromechanical systems (MNEMS). An embodiment produces a single-crystalline device fabricated on a single-sided polished wafer. It employs processing from only the front-side, resulting in a significant separation between the device and substrate that is realized by an isotropic etch.

Embodiments of the process can form devices employing an SOI (or similar) wafer or by implanting a buried layer with etch characteristics different from the substrate (e.g. an oxide layer). If other than an SOI wafer is used, a material with etch characteristics different from the substrate or a material that will react with the substrate to form a material with etch characteristics different from the substrate is ion implanted into the substrate to form the underside of the device.

Generally, when SOI or implanting is mentioned, any wafer including various materials may be used provided the middle material is not etched by the first or third etch.

Embodiments support single crystal (high-Q) structures, hermetic wafer-level packaging, CMOS-compatibility, and minimal deviations from or additions to existing CMOS processes.

One embodiment includes a method for producing a micro/nanoelectromechanical system (MNEMS) device that comprises providing a multilayer wafer that comprises an upper layer, a middle layer, and a substrate; forming a device in the upper layer material, where gaps are defined in the upper layer material; filling the gaps with at least one protective gap material where the at least one protective gap material has etch characteristics that are different from the etch characteristics of the device's upper layer material and different from the substrate. It further includes removing at least a top portion of the at least one protective gap material from the upper layer; etching the at least one protective gap material, wherein a portion of the at least one protective gap material remains on the sidewalls of the surrounding upper layer; etching the substrate beneath the device, excluding the middle layer, thereby releasing the device from the substrate; and etching the middle layer wherein the etch of the step of etching the middle layer is selective to the middle layer and the at least one protective gap material.

In other embodiments, forming a device in the upper layer comprises a deep reactive ion etch (DRIE), and the step of removing at least a top portion of the at least one protective gap material comprises chemical-mechanical polishing (CMP).

Another embodiment further comprises a step of at least partially forming circuitry, performed after the step of removing at least a top portion of the at least one protective gap material. In one embodiment, the step of etching the at least one protective gap material comprises deep reactive ion etching (DRIE). In another embodiment, the step of etching the at least one protective gap material comprises a xenon difluoride ($XeF_2$) etch.

For other embodiments, the at least one protective gap material is one protective gap material and the step of etching the at least one protective gap material comprises a directional, anisotropic etch. For yet another embodiment, the directional, anisotropic etch comprises a deep reactive ion etch (DRIE). For additional embodiments, the etch of the step of etching the substrate beneath the device is selected from the group consisting of: an isotropic etch, a first anisotropic etch followed by an isotropic etch, and a cycling of anisotropic/isotropic etches. For still other embodiments, the steps are performed in any order providing that high temperature processes of forming the device are performed before forming circuitry.

One embodiment includes a method for producing a micro/nanoelectromechanical system (MNEMS) device comprising: providing a multilayer wafer comprising an upper layer, a middle layer, and a substrate; forming a device in the upper layer by defining gaps wherein a protecting layer is deposited on the upper layer, and where the protecting layer gap material has etch characteristics that are different from the etch characteristics of the upper layer and the substrate; etching through the middle layer; etching the substrate beneath the device, excluding the middle layer, thereby releasing the device from the substrate; and etching the middle layer wherein the etch of the step of etching the middle layer is selective to the middle layer and the protecting layer. In embodiments, the wafer comprises circuitry.

In other embodiments, the step of forming a device comprises deep reactive ion etching (DRIE) and the step of forming a device also comprises etchants selected from the group consisting of: sulfur hexafluoride ($SF_6$), oxygen ($O_2$), and silicon tetrafluoride ($SiF_4$).

For further embodiments, the step of etching the substrate comprises removing substrate beneath device while reforming a protecting layer. For still other embodiments, the steps are performed in any order providing that high temperature processes of forming the device are performed before forming circuitry.

One embodiment includes an implant method for producing a micro/nanoelectromechanical system (MNEMS) device comprising: providing a substrate; implanting a middle layer; etching to the implanted middle layer, thereby delineating a device; etching through the implanted middle layer, thereby removing the substrate beneath the device; and removing the implanted middle layer beneath the device. In other embodiments, the substrate comprises circuitry. In yet other embodiments, the etching to the implanted middle layer step comprises a deep reactive ion etch (DRIE). For other embodiments, these steps may be performed in any order, providing that high temperature processes of forming the device are performed before forming circuitry.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
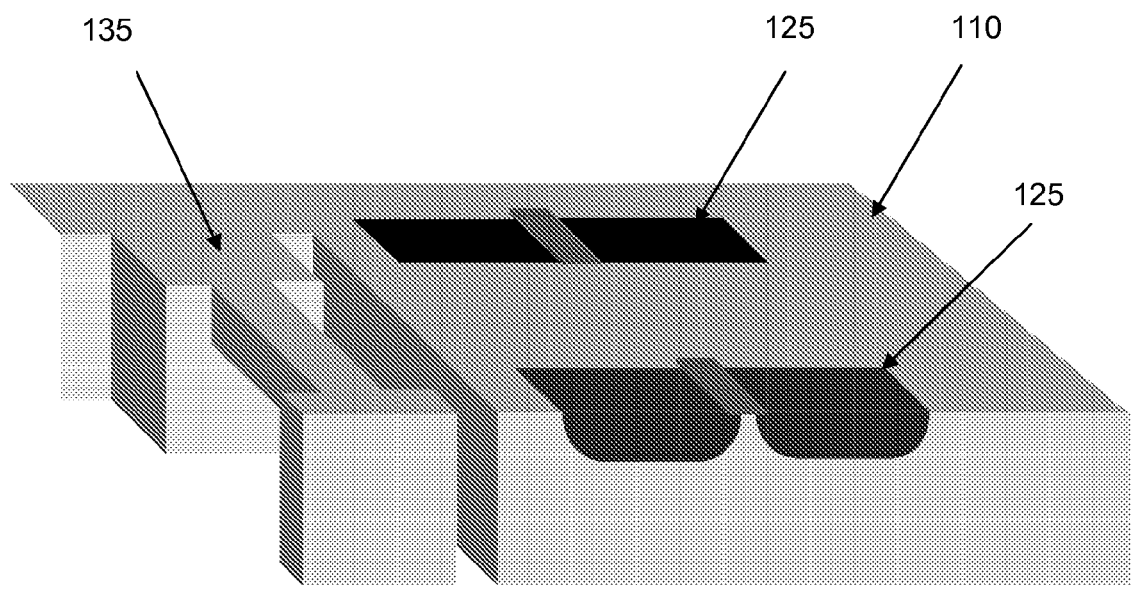
FIG. 1 is a perspective diagram illustrating a device configured in accordance with one embodiment of the present invention.

In one embodiment, begin with (1) a CMOS wafer with circuitry already fabricated. (2) Etch trenches to define MEMS structure using an anisotropic etch. During the etch, a protective layer is deposited simultaneously and remains only on the sidewalls of the etched cavity. In one embodiment, the etch could use sulfur hexafluoride ($SF_6$) to etch the silicon and oxygen ($O_2$) to form the protective layer on the sidewalls. In another embodiment, the protective layer is formed from a combination of $O_2$, $SiF_4$, and $SF_6$. In another embodiment, the protective layer is $SiO_2$ formed from an $O_2$ plasma (plasma-enhanced oxidation). (3) The etch is either timed or stops on a middle layer (e.g. SOI) whose etch characteristics are different from that of the materials above and below. The middle layer can be formed, for example, by either pre-CMOS (e.g. bonded SOI, Separation by Implantation of Oxygen (SIMOX), etc.) or post-CMOS (SIMOX, ion implantation). (4) The middle layer is removed from the bottom of the trenches via an etch (e.g. reactive ion etch (RIE)/DRIE, wet etch, etc.) to expose the substrate material. (5) The substrate is then etched isotropically, first anisotropically and then isotropically, or by cycling between anisotropic and isotropic etches. The protective layer may be removed during the etch of the middle layer. As a result, the etch to remove the substrate may first require the reformation of a protective layer, and its removal at the bottom of the trench (e.g. via an anisotropic etch). (6) The middle layer is etched (e.g. using a vapor HF etch).

In another embodiment, begin with: (1) a wafer with circuitry fabricated. (2) Etch trenches to define a MEMS structure using an anisotropic etch. The etch is either timed or stops after etching to the middle layer. The middle layer can either be preexisting (e.g. SOI) or formed after CMOS (ion-implantation). (3) A thin protective layer is formed on the sidewalls. This could be done before or after step 4. If after step 4, this requires an etch that will remove this layer from the bottom of the trenches. (4) The middle layer is etched at the bottom of the trenches. (5) The substrate material is then etched isotropically, anisotropically first and then isotropically, or by cycling between anisotropic and isotropic etches. (6) The middle layer is etched (e.g. such as vapor HF etch).

In another embodiment, (1) etch trenches into wafer. The etch is either timed or stops on a middle layer. The middle layer can be preexisting (e.g. SOI) or formed after CMOS (e.g. ion-implantation). (2) the middle layer is etched to expose the substrate (3) the trenches are refilled (e.g. CVD, vapor deposition (VD), or deposition) and then etched-back using anisotropic etch, chemical-mechanical polishing or planarization (CMP), or similar) with either a protective material whose etch characteristics are different from the wafer material above and below the middle layer, or first a thin conformal protective layer (e.g. silicon dioxide) with the bottom removed via an anisotropic etch, followed by the deposition of a second material with different etch characteristics from the protective layer (e.g. polycrystalline silicon), but whose characteristics may be similar to the materials above and below the middle layer. (4) CMOS circuitry is created. (5) Trenches that were refilled are etched such that protective layer remains on the sidewalls, the etch continues until the substrate material is exposed. (6) The substrate material is then etched isotropically, first anisotropically and then isotropically, or by cycling between anisotropic and isotropic etches. (7) The protective layer and middle layer are etched (e.g. such as vapor HF etch).

FIG. 1 is a perspective diagram illustrating a structure 100 including substrate 110 with circuitry 125 and device 135 configured in accordance with one embodiment of the present invention.

FIGS. 2A through 2H constitute a sequence of schematic drawings showing a plurality of certain steps in the process of manufacturing a silicon-on-insulator device including an intermediate step of fabricating circuitry in accordance with one embodiment of the present invention.

Figure 2A:
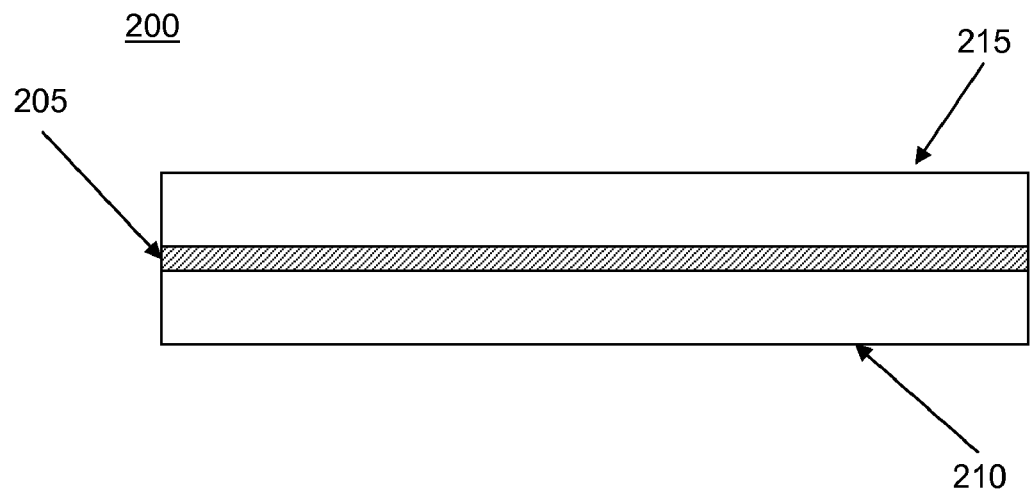
FIGS. 2A-2H are sectional elevation views illustrating a plurality of processing steps for fabricating a multilayer or a silicon-on-insulator MEMS device configured in accordance with one embodiment of the present invention.

FIG. 2A is a sectional elevation view 200 of a multilayer or a silicon-on-insulator (SOI) wafer substrate depicting a middle insulator layer 205 between silicon layers 210 and 215. This corresponds to step 1405 of the flow chart in FIG. 4.

Figure 2B:
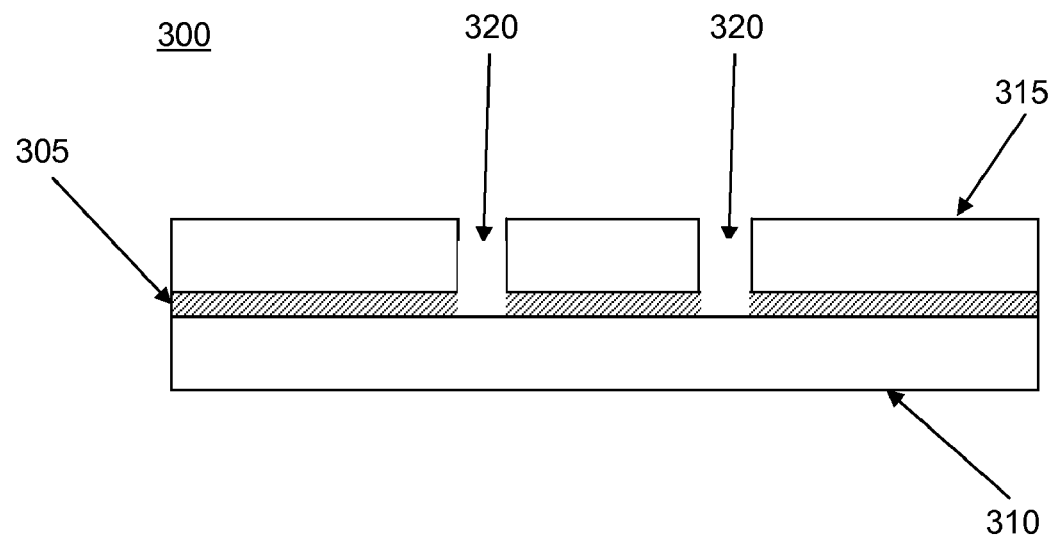

In FIG. 2B, trenches 320 may be formed in silicon layer 315 using processes such as photolithography and etching technology such as reactive ion etch (RIE) to include deep reactive ion etch, well known to those skilled in the art. Middle insulator layer 305 is etched while silicon layer 310 of structure 300 may or may not be etched. This corresponds to step 1410 of the flow chart in FIG. 4.

Figure 2C:
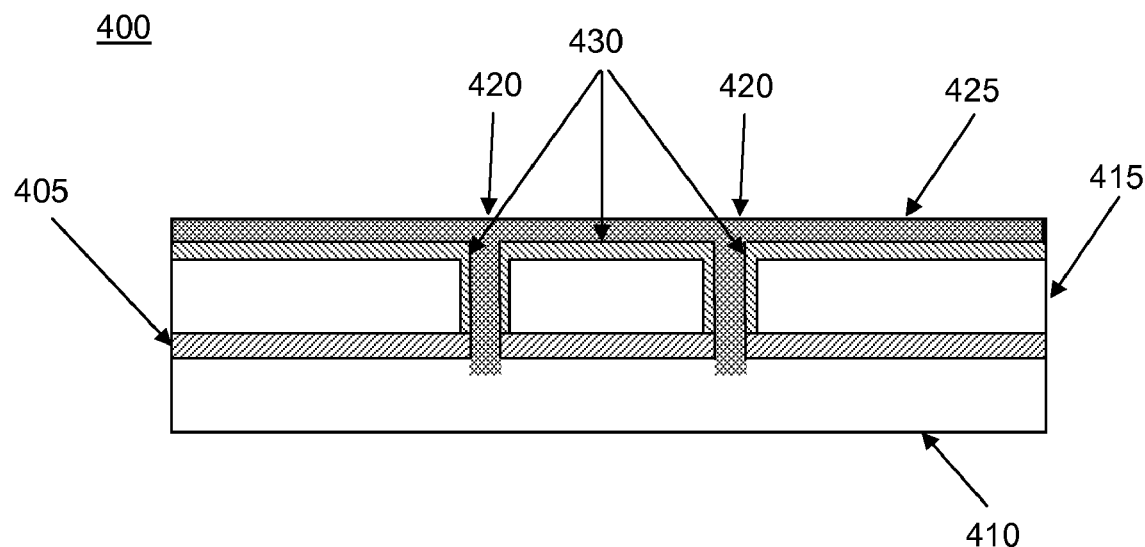

FIG. 2C depicts formation of first protective material 430, whose etch characteristics differ from that of the material forming the device, and second gap filling material layer 425 on the top surface of silicon layer 415, filling trench areas 420. Any material 430 that is not etched by the etch used for the gap filling material 425 or the substrate 410 may be employed. Material layers 430 and 425 may fill or cover the sidewalls. Sidewall covering is employed when the MEMS device is fabricated after CMOS fabrication. Filling may be used if the MEMS device is fabricated before or after CMOS. As an example, the oxide of material layer 415 may be grown or deposited. In another embodiment, instead of the oxide material layer insulator, an etch of silicon layer 415 may result in insulated sidewalls as a byproduct of the etch. Any etch may be employed where a protective material is deposited during the etch (e.g. a cryo-etch). Middle layer 405 and silicon layer 410 of structure 400 remain. This corresponds to step 1415 of the flow chart in FIG. 4.

Figure 2D:
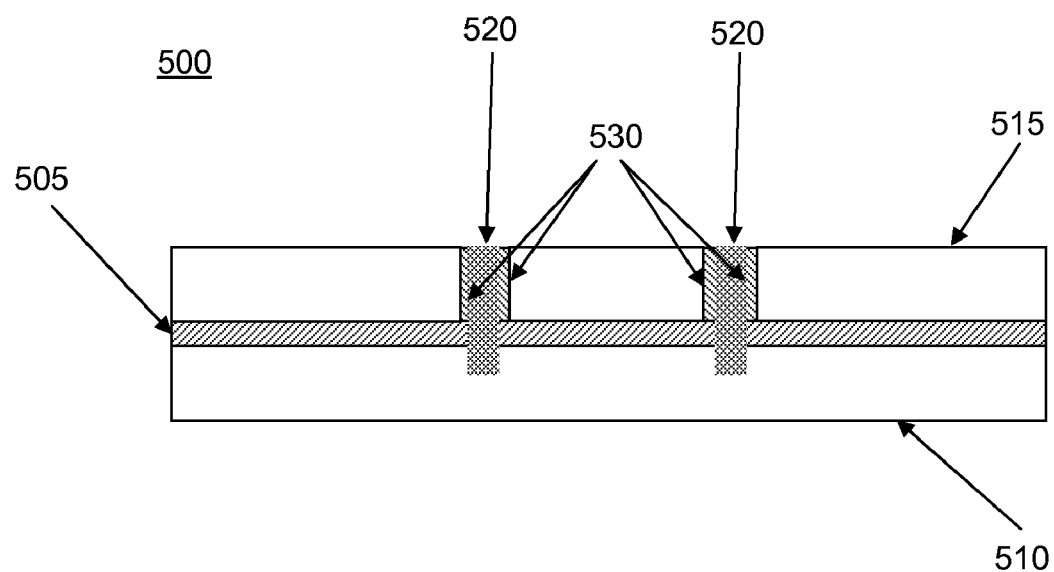

In FIG. 2D, a top portion of materials 430 and 425 of FIG. 2C may be removed from top layer of silicon 515, leaving first and second, materials in trenches 520. Removal may be by processes such as chemical-mechanical polishing or planarization. (CMP) of structure 500. In one embodiment, removal may be by an anisotropic etch such as RIE, or an isotropic etch such as HF. The timing of the etch should be controlled to ensure that the trench fill-material is not removed. Layers 505 and 510 remain. This corresponds to step 1420 of the flow chart in FIG. 4.

Figure 2E:
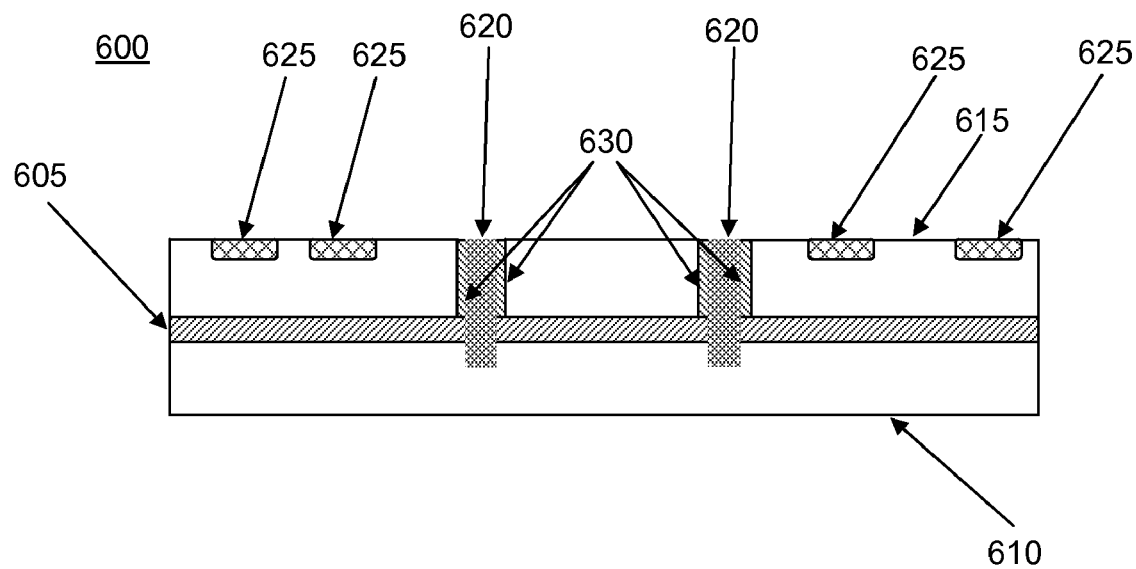

The sectional elevation view of structure 600 of FIG. 2E depicts optional formation of circuitry 625 in layer 615 in a conventional manner. Circuitry may be placed at various locations on the wafer or die. The circuitry formation or partial formation step is preferably performed when there will be no subsequent processing steps that may jeopardize the integrity of circuitry 625. This may include high temperature processes. Trenches 620 and layers 605 and 610 remain. This corresponds to step 1425 of the flow chart in FIG. 4.

Figure 2F:
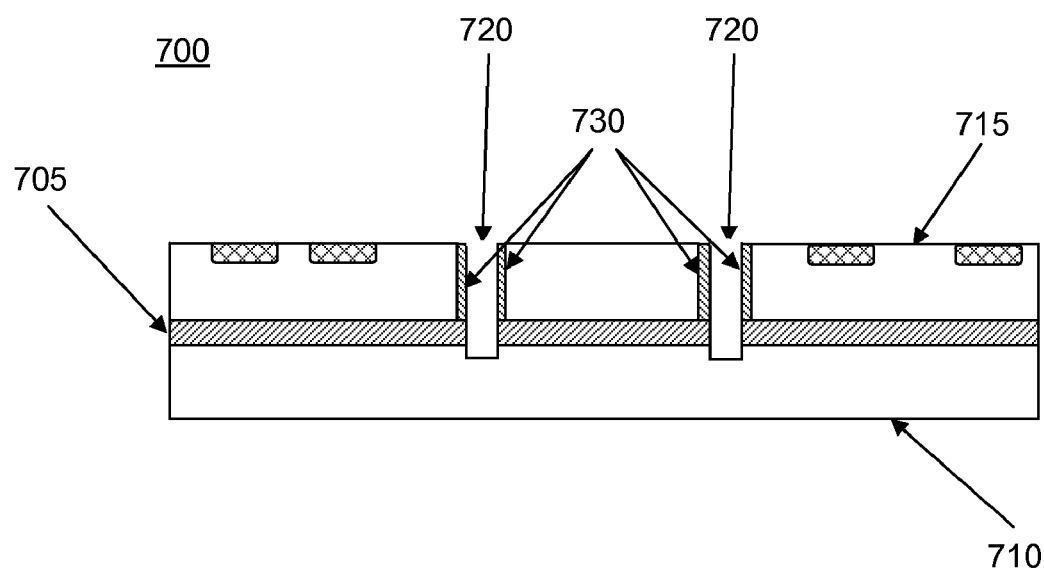

FIG. 2F depicts an etch of the gap filling material in trenches 620 of FIG. 2E (also shown as gap filling material 425 from FIG. 2C) such that material 730 remains on the sides of trenches 720 of layer 715. A directional, anisotropic etch such as DRIE may be employed if the second gap filling material is not used. Otherwise, if a second gap filling material is used, the etch can be either isotropic or anisotropic. The etch extends through layer 705 into layer 710 of structure 700. This corresponds to step 1430 of the flow chart in FIG. 4. This etch could include a xenon difluoride ($XeF_2$) etch.

Figure 2G:
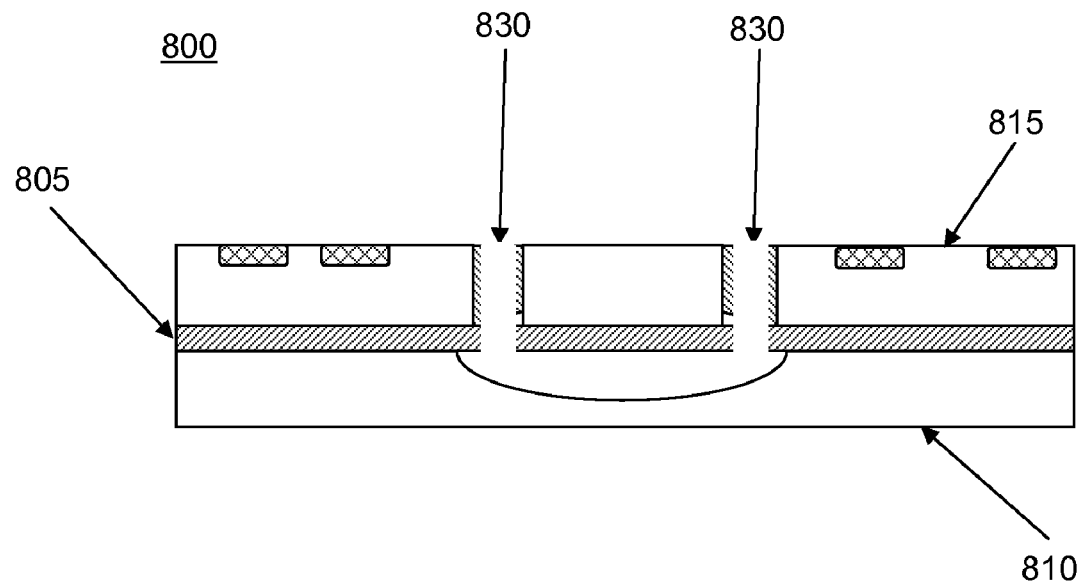

In FIG. 2G, an isotropic or combination anisotropic/isotropic etch is used to remove the material of substrate layer 810 beneath the device, but not remove middle insulating layer 805 beneath the device, thereby releasing the device from the substrate 810. Protective material remains on the sides of trenches 830 of layer 815 of structure 800. This corresponds to step 1435 of the flow chart in FIG. 4.

Figure 2H:
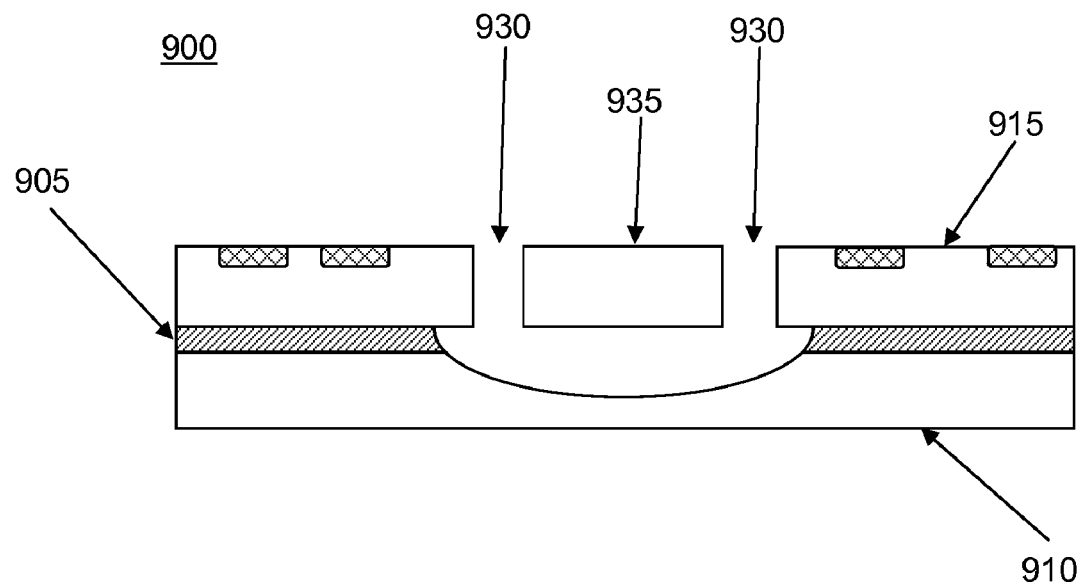

FIG. 2H shows middle material 905 beneath trench-delineated device 935 removed in an etch which is selective to just the middle insulator and gap-filling material. Protective material on the sides of trenches 930 of layer 915 of structure 900 is removed as well as middle material 905. This corresponds to step 1440 of the flow chart in FIG. 4.

FIGS. 3A through 3E represent a sequence of schematic drawings showing a plurality of certain steps in the process of manufacturing an implant process device in accordance with another embodiment of the present invention.

Figure 3A:
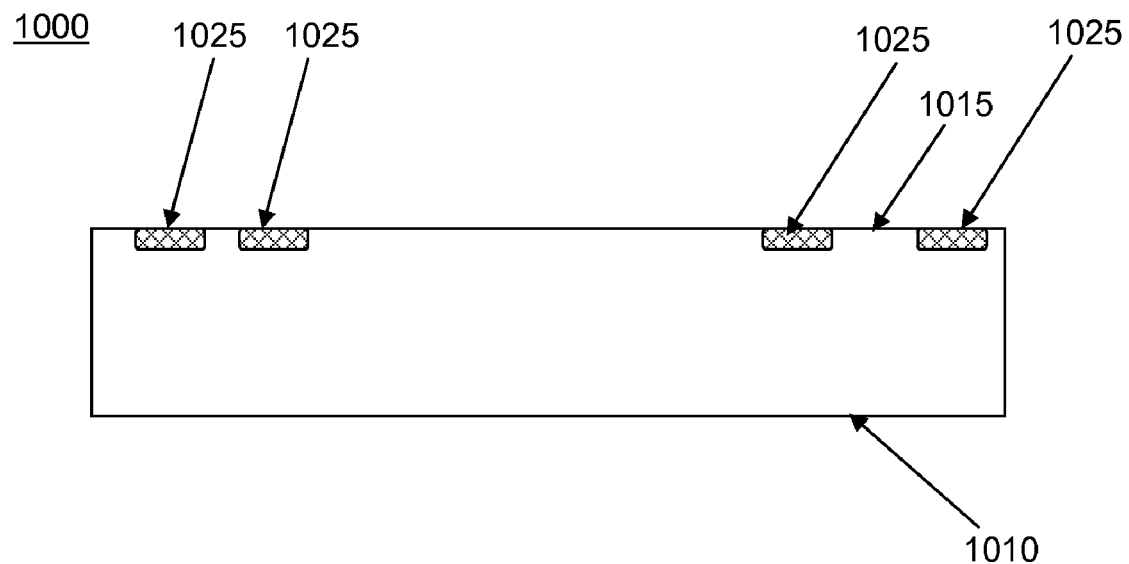
FIGS. 3A-3E are sectional elevation views illustrating a sequence of processing steps for an implant fabricating process for a MEMS device configured in accordance with one embodiment of the present invention.

FIG. 3A is an implant process initial step illustrating structure 1000 including optional formation of circuitry 1025 on surface 1015 of substrate 1010 in a conventional manner. Circuitry may be placed at various locations on the wafer or die. The circuitry formation or partial formation step is preferably performed when there will be no subsequent processing steps that may jeopardize the integrity of circuitry. This corresponds to step 1505 of the flow chart of FIG. 5.

Figure 3B:
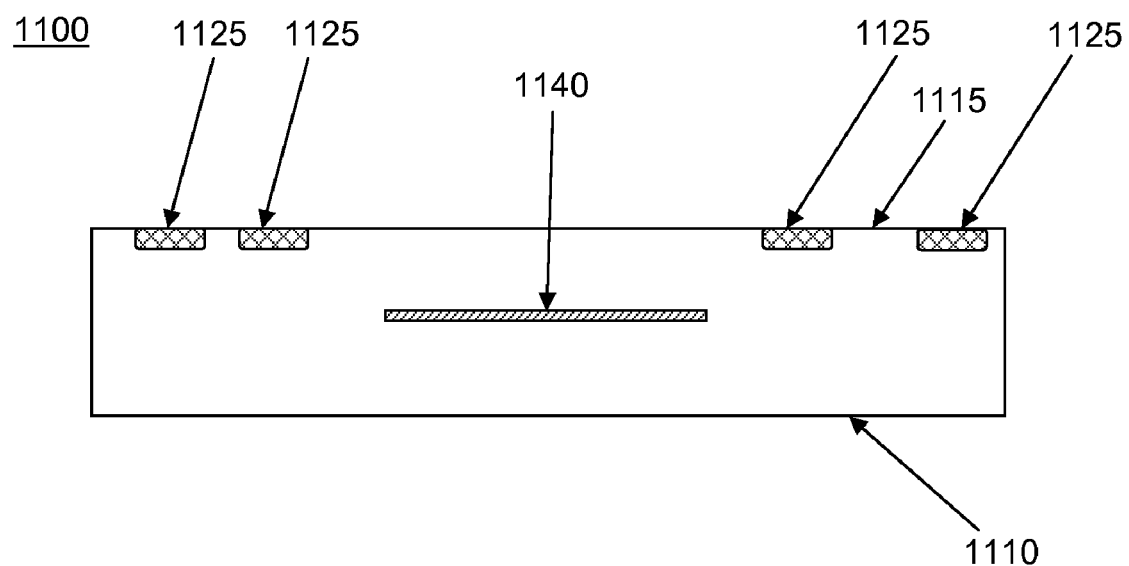

FIG. 3B shows implanted insulator 1140 in structure 1100 including circuitry 1125 on surface 1115 of substrate 1110. The implanted insulating material 1140, or a material that will react with the substrate to form an insulating material, is ion implanted into the substrate to form the underside of the device. This corresponds to step 1510 of the flow chart of FIG. 5.

Figure 3C:
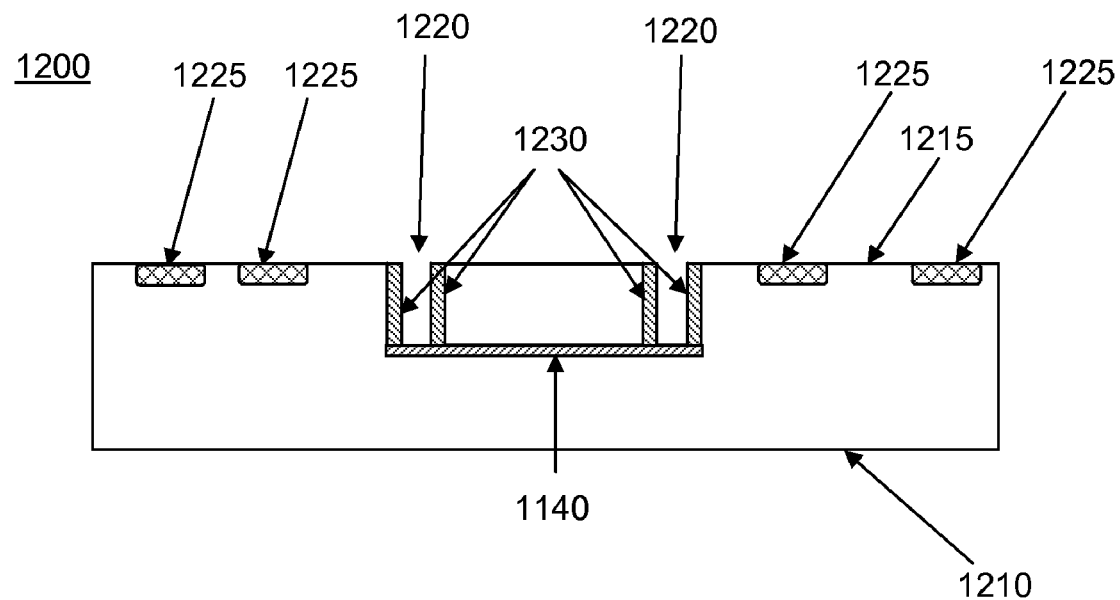

FIG. 3C depicts an etching of structure 1200 where trenches 1220 are formed from surface 1215 in substrate 1210 to or through implanted insulator layer 1140. This is an anisotropic etch for which the implanted insulating layer may act as an etch-stop and may be either a dry etch (DRIE or RIE) or a wet etch. Also depicted is protective layer 1230 formed on the side walls of trenches 1220, formed by etching. Structure 1200 may include circuitry 1225 on surface 1215 of substrate 1210. This corresponds to step 1515 of the flow chart of FIG. 5.

Figure 3D:
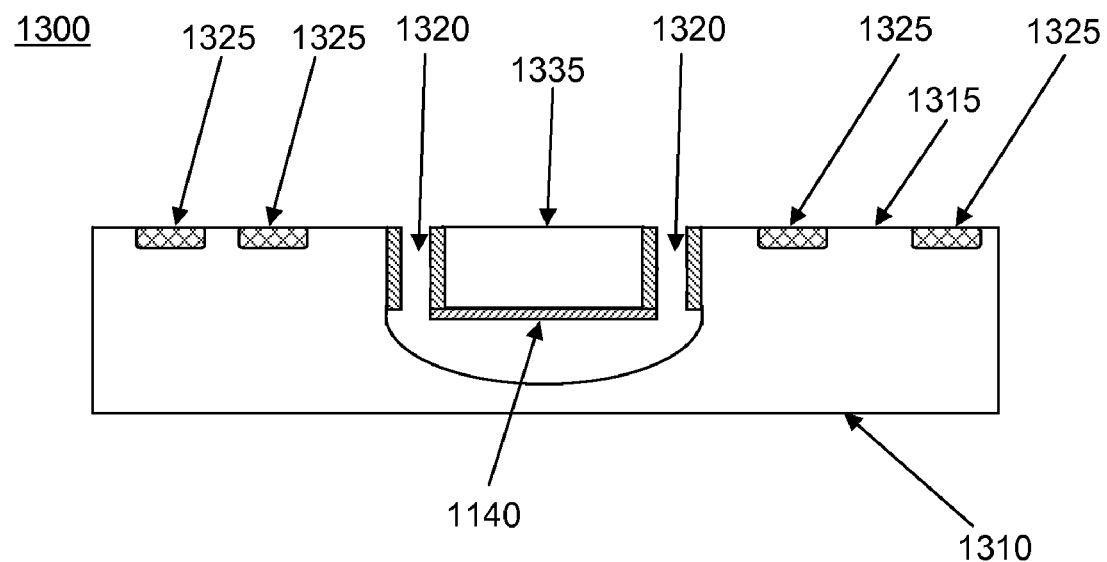

In FIG. 3D, substrate 1310 beneath device 1335 is removed. This may include etching through the implanted layer 1140 under trenches 1320 and removal of the substrate beneath the device with an isotropic etch (or anisotropic/isotropic combination) followed by removal of the implanted material 1140. This releases trench-delineated device 1335 from substrate 1310. This corresponds to step 1520 of the flow chart of FIG. 5.

Figure 3E:
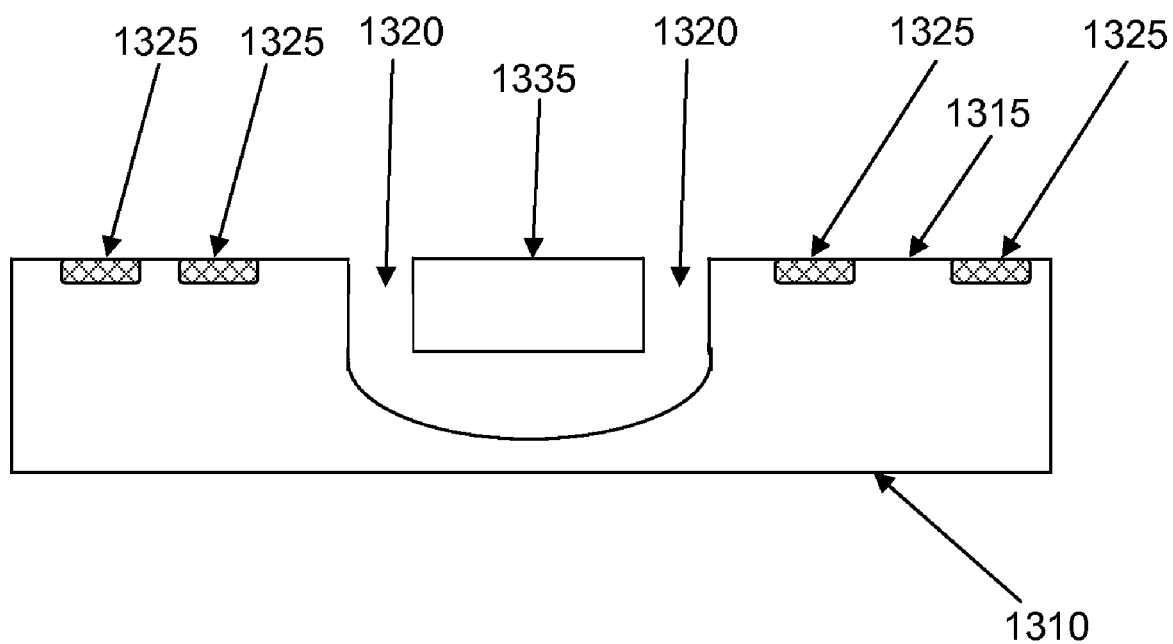

In FIG. 3E, implanted insulating layer 1140 beneath device 1335 and protective layer 1230 of FIG. 3C are removed, if not removed in the step of FIG. 3D. This corresponds to step 1525 of the flow chart of FIG. 5.

Figure 4:
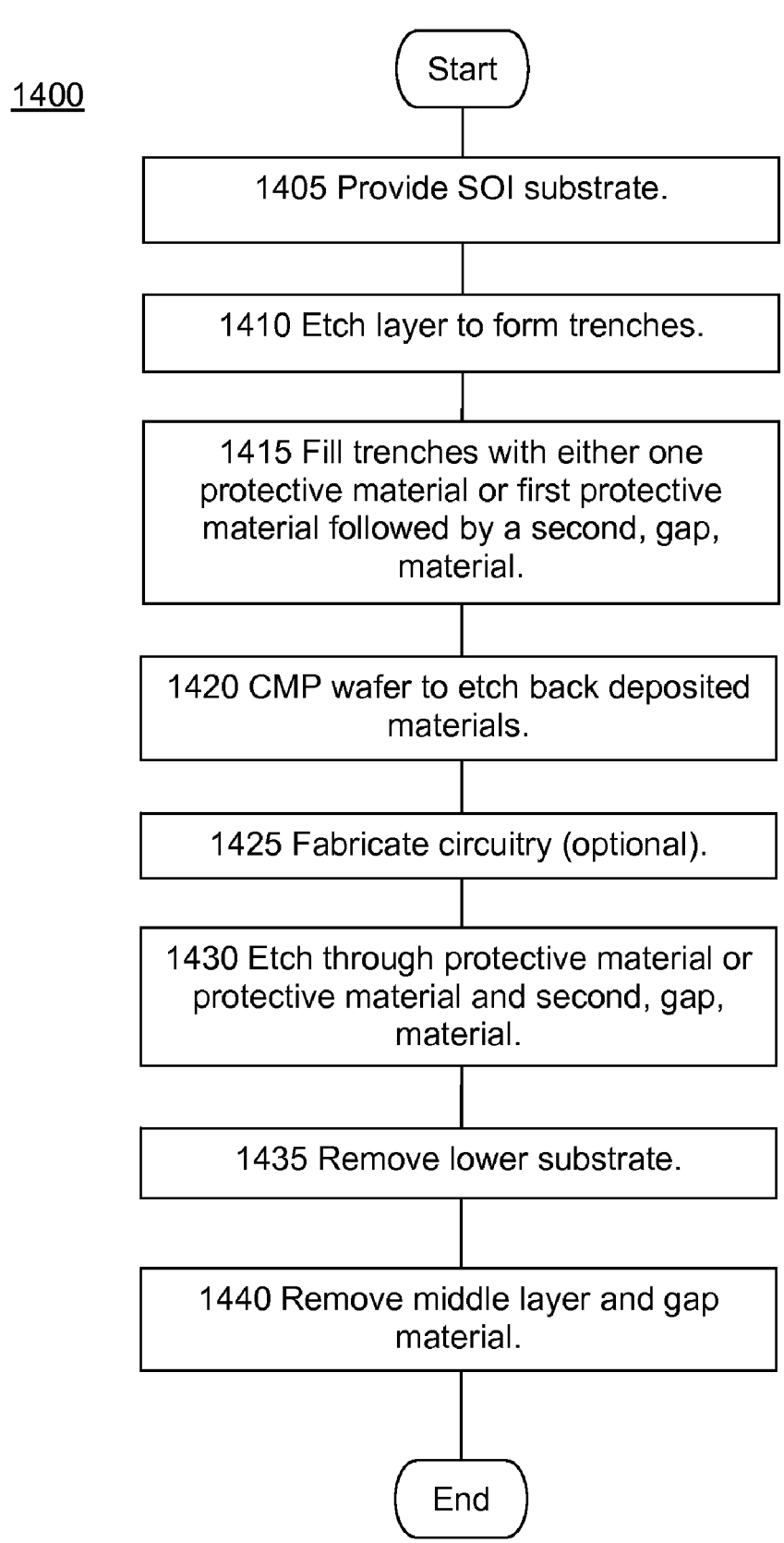
FIG. 4 is a flow chart depicting a multilayer or a silicon-on-insulator fabrication process where circuitry is provided after etching and insulating the upper layer in accordance with one embodiment of the present invention.

FIG. 4 is a flow chart depicting an embodiment of a multilayer or a silicon on insulator fabrication process 1400 including the steps of: providing a multilayer or a silicon on insulator (SOI) substrate 1405; etching a silicon layer (and perhaps middle layer) to form trenches 1410; depositing one protective layer or a first protective and then a second gap filling material on an upper layer 1415; removing the protective layer or protective layer and gap filling material by, for example, CMP 1420; optionally fabricating circuitry 1425; etching through the one protective layer or first and second material layers 1430; removing silicon beneath the trench-delineated device 1435; and removing the middle layer beneath the device 1440.

Figure 5:
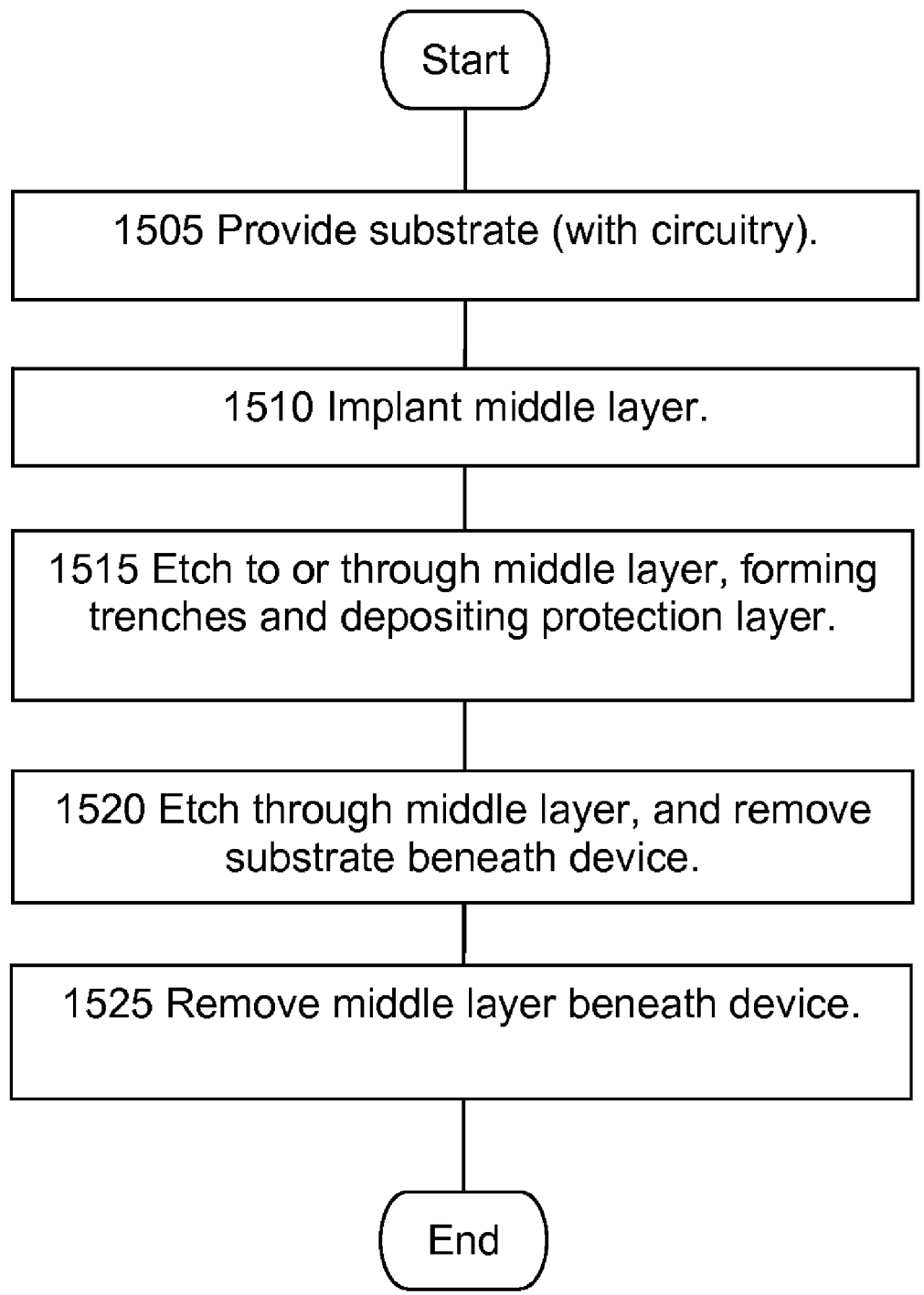
FIG. 5 is a flow chart depicting an implant fabrication process in accordance with one embodiment of the present invention.

FIG. 5 is a flow chart depicting an embodiment of an implant process 1500 including the steps of: providing a substrate optionally configured with circuitry 1505; implanting a middle layer 1510; etching to or through the implanted layer 1515; wherein trench side walls are protected, removing substrate beneath device for step 1520; and removing implanted insulator layer 1525.

Figure 6:
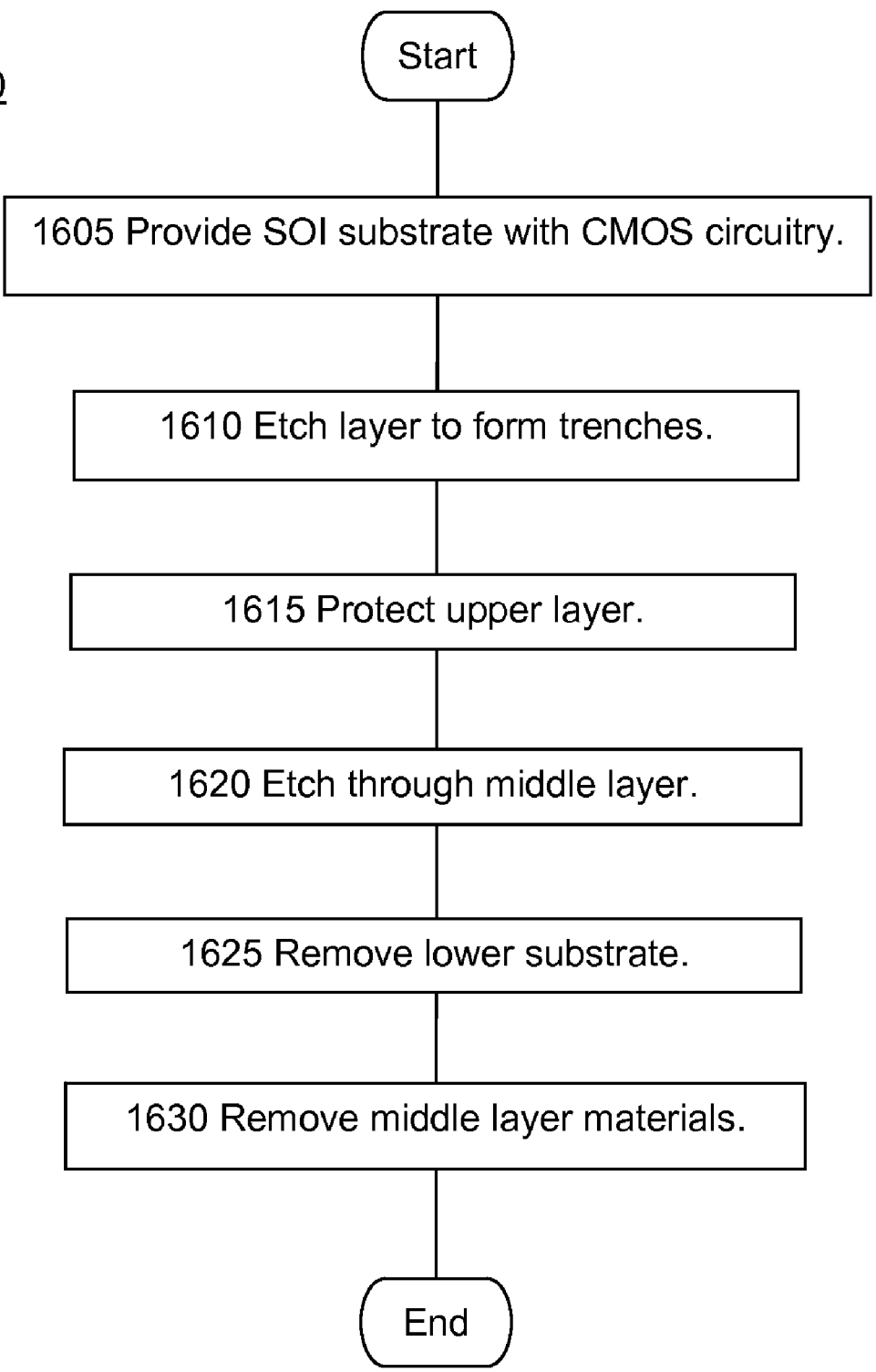
FIG. 6 is a flow chart depicting a multilayer or a silicon-on-insulator fabrication process where circuitry is provided before MEMS device etching steps in accordance with one embodiment of the present invention.

FIG. 6 is a flow chart depicting an embodiment of a fabrication process 1600 including the steps of providing a multilayer or an SOI wafer with CMOS devices 1605; etching to or through the middle layer 1610 to form trenches; protecting the trenches formed in the upper layer 1615 (to passivate/insulate the sidewalls); removing the protective layer at the bottom of the trenches through a directional etch 1620; removing the substrate beneath the device through an isotropic etch 1625; and then the middle materials are removed 1630.

Figure 7:
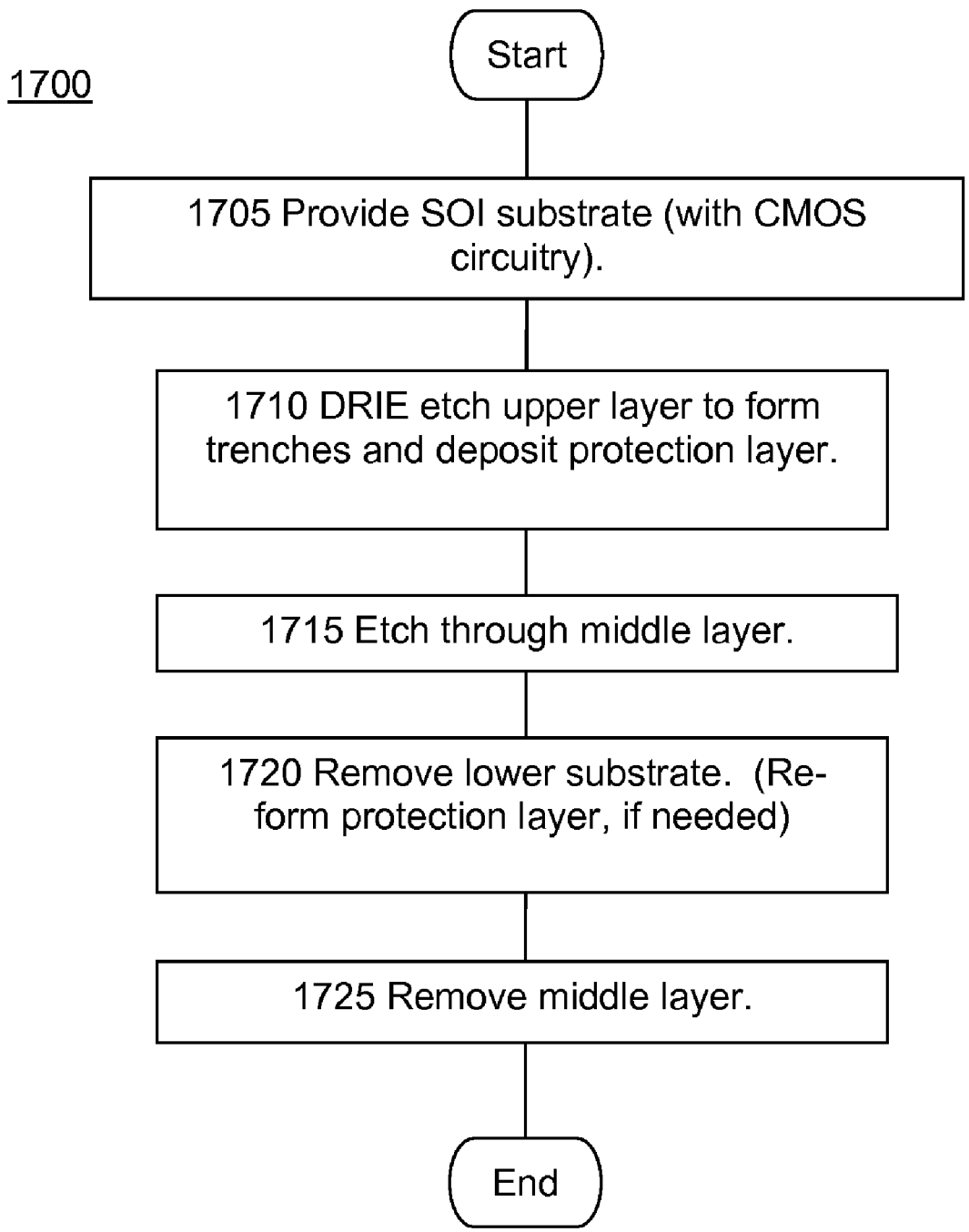
FIG. 7 is a flow chart depicting a multilayer or a silicon-on-insulator fabrication process using an etch with simultaneous deposition of a protective layer in accordance with one embodiment of the present invention.

FIG. 7 is a flow chart depicting an embodiment of a multilayer or a silicon on insulator fabrication process 1700 using a cryo-etch. This simultaneously deposits the protective layer during the etch of the upper layer using $SF_6$ and passivates/insulates the sidewalls using condensation of oxides. It includes the steps of: providing a substrate optionally configured with circuitry 1705; cryo-etching to the middle layer 1710, wherein trench side walls are protected with a protective layer; etching through middle layer 1715; removing substrate beneath device while reforming the protective layer, if needed 1720; and removing middle layer 1725.

Embodiments may include the following steps for fabricating a CMOS-compatible silicon device: 1) deposit a field oxide; 2) etch the oxide/active area; 3) etch silicon to form resonator or other device; 4) grow gate oxide; 5) deposit polysilicon #1; 6) etch polysilicon; 7) source/drain doping; 8) include intra-poly dielectrics; 9) deposit polysilicon #2; 10) include poly-metal dielectrics; 11) deposit metal layer #1; 12) deposit intra-metal dielectrics; 13) deposit metal layer #2; 14) passivation; 15) etch openings (e.g. DRIE); 16) isotropic silicon etch (Release step #1); 17) HF vapor-phase etch (Release step #2); 18) deposit glass frit; and 19) melt glass frit under vacuum.

Note that the steps may be performed in alternate orders providing that high temperature processes are preferably performed before forming the circuitry.

Summarizing, embodiments include using CVD, vapor deposition (VD), or thermal oxidation to produce sidewall protection. Methods use the condensation of material on the sidewalls to form the protection layer, this is performed during the etches, and not in a separate step. Some etches do not include $SF_6$ and $O_2$ as etch gases. In addition, the buried oxide layer of embodiments presented is etched before the protection layer is deposited. Also, one procedure of embodiments is to create devices by refilling the trenches, and then etching out the interior of the trench. Furthermore, a middle layer can be formed in only certain parts of the wafer by ion implantation.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method for producing a micro/nanoelectromechanical system (MNEMS) device comprising:
   providing a multilayer wafer comprising an upper layer, a middle layer, and a substrate;
   forming a device in said upper layer material, wherein gaps are defined in said upper layer material;
   filling said gaps with at least one protective gap material wherein said at least one protective gap material has etch characteristics different from etch characteristics of said device upper layer material and said substrate;
   removing at least a top portion of said at least one protective gap material from said upper layer;
   etching said at least one protective gap material, wherein a portion of said at least one protective gap material remains on sidewalls of surrounding said upper layer;
   etching said substrate beneath said device excluding said middle layer, thereby releasing said device from said substrate; and
   etching said middle layer wherein etch of said step of etching said middle layer is selective to said middle layer and said at least one protective gap material.

2. The method of claim 1, wherein said forming a device in said upper layer comprises a deep reactive ion etch (DRIE).

3. The method of claim 1, wherein said step of removing at least a top portion of said at least one protective gap material comprises chemical-mechanical polishing (CMP).

4. The method of claim 1, further comprising a step of at least partially forming circuitry performed after said step of removing at least a top portion of said at least one protective gap material.

5. The method of claim 1, wherein said step of etching said at least one protective gap material comprises deep reactive ion etching (DRIE).

6. The method of claim 1, wherein said step of etching said at least one protective gap material comprises a xenon difluoride ($XeF_2$) etch.

7. The method of claim 1, wherein said at least one protective gap material is one protective gap material and said step of etching said at least one protective gap material comprises a directional, anisotropic etch.

8. The method of claim 1, wherein etch of said step of etching said substrate beneath said device is selected from the group consisting of: an isotropic etch, a first anisotropic etch followed by an isotropic etch, and a cycling of anisotropic/isotropic etches.

9. The method of claim 1, wherein said steps are performed in any order providing that high temperature processes of forming said device are performed before forming circuitry.

10. A method for producing a micro/nanoelectromechanical system (MNEMS) device comprising:
    providing a multilayer wafer comprising an upper layer, a middle layer, and a substrate;
    forming a device in said upper layer by defining gaps wherein a protecting layer is deposited on said upper layer, wherein said protecting layer has etch characteristics different from etch characteristics of said upper layer and said substrate;
    etching said substrate beneath said device excluding said middle layer, thereby releasing said device from said substrate; and
    etching said middle layer wherein etch of said step of etching said middle layer is selective to said middle layer and said protecting layer.

11. The method of claim 10, wherein said wafer comprises circuitry.

12. The method of claim 10, further comprising a step of etching through said middle layer performed after said step of forming a device.

13. The method of claim 10, wherein said step of forming a device comprises deep reactive ion etching (DRIE).

14. The method of claim 10, wherein said step of forming a device comprises etchants selected from the group consisting of: sulfur hexafluoride ($SF_6$), oxygen ($O_2$), and silicon tetrafluoride ($SiF_4$).

15. The method of claim 10, wherein said step of etching said substrate comprises removing substrate beneath device while reforming a protecting layer.

16. The method of claim 10, wherein said steps are performed in any order providing that high temperature processes of forming said device are performed before forming circuitry.

17. An implant method for producing a micro/nanoelectromechanical system (MNEMS) device comprising:
    providing a substrate;
    implanting a middle layer;
    etching to said implanted middle layer, thereby delineating a device;
    etching through said implanted middle layer, thereby removing substrate beneath said device; and
    removing said implanted middle layer beneath said device.

18. The method of claim 17, wherein said substrate comprises circuitry.

19. The method of claim 17, wherein said etching to said implanted middle layer step comprises a deep reactive ion etch (DRIE).

20. The method of claim 17, wherein steps may be performed in any order providing that high temperature processes of forming said device are performed before forming circuitry.

* * * * *